(12) United States Patent
Choi et al.

(10) Patent No.: US 11,019,743 B2
(45) Date of Patent: May 25, 2021

(54) DISPLAY DEVICE AND METHOD OF MANUFACTURING THE SAME

(71) Applicant: Samsung Display Co. Ltd., Yongin-si (KR)

(72) Inventors: Hyun Woo Choi, Hwaseong-si (KR); Jun Ho Kwack, Chungcheongnam-do (KR); Ji Yun Bang, Cheonan-si (KR); Jae Young Sim, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 149 days.

(21) Appl. No.: 16/244,348

(22) Filed: Jan. 10, 2019

(65) Prior Publication Data

US 2019/0215976 A1    Jul. 11, 2019

(30) Foreign Application Priority Data

Jan. 10, 2018    (KR) .......................... 10-2018-0003527

(51) Int. Cl.
| | |
|---|---|
| *H05K 1/18* | (2006.01) |
| *H01L 51/52* | (2006.01) |
| *H01L 51/56* | (2006.01) |
| *H05K 5/03* | (2006.01) |
| *H05K 5/00* | (2006.01) |
| *H01L 51/00* | (2006.01) |
| *G02F 1/1362* | (2006.01) |
| *H01L 27/32* | (2006.01) |

(52) U.S. Cl.
CPC ............. *H05K 5/03* (2013.01); *G02F 1/1362* (2013.01); *H01L 51/0097* (2013.01); *H01L 51/524* (2013.01); *H01L 51/5246* (2013.01); *H01L 51/5259* (2013.01); *H01L 51/56* (2013.01); *H05K 1/189* (2013.01); *H05K 5/0017* (2013.01); *H01L 27/3244* (2013.01); *H01L 2251/5338* (2013.01); *H05K 2201/09027* (2013.01); *H05K 2201/10128* (2013.01)

(58) Field of Classification Search
CPC ................................. H05K 5/03; G02F 1/1362
See application file for complete search history.

(56) References Cited

U.S. PATENT DOCUMENTS 9,201,459 B2 * 12/2015 Lee ...................... G06F 1/1656
9,298,220 B2 *  3/2016 Choi ..................... G06F 1/1626
(Continued)

FOREIGN PATENT DOCUMENTS

| KR | 1020150109743 A | 10/2015 |
|----|-----------------|---------|
| KR | 1020160117799 A | 10/2016 |

(Continued)

*Primary Examiner* — Irfan Habib
(74) *Attorney, Agent, or Firm* — Cantor Colburn LLP

(57) ABSTRACT

A display device includes: a display panel which is curved and displays an image; a cover window which is disposed on a front surface of the display panel at which the image is displayed; and a cover panel which is curved and disposed on a curved back surface of the display panel opposite to the front surface thereof. The cover panel is defined by a flat cover panel which is curved by attachment thereof to the curved back surface of the display panel, and the flat cover panel which is curved to define the cover panel includes a cutout portion therein recessed from an outer edge of the flat cover panel toward a center of the flat cover panel.

20 Claims, 12 Drawing Sheets

(56) References Cited

U.S. PATENT DOCUMENTS

| | | | | |
|---|---|---|---|---|
| 9,342,105 B2* | 5/2016 | Choi | ............... | G06F 3/0488 |
| 10,044,353 B2* | 8/2018 | Yilmaz | ............... | H03K 17/9622 |
| 10,098,245 B2* | 10/2018 | Lin | ............... | H05K 5/0017 |
| 10,120,410 B2* | 11/2018 | Yamazaki | ............... | G06F 1/1601 |
| 10,143,098 B1* | 11/2018 | Lee | ............... | E05D 3/18 |
| 10,289,155 B2* | 5/2019 | Cheng | ............... | G06F 1/1637 |
| 10,327,349 B2* | 6/2019 | Lee | ............... | H05K 7/1417 |
| 10,477,987 B2* | 11/2019 | White | ............... | G09F 3/203 |
| 10,509,439 B2* | 12/2019 | Choi | ............... | G06F 1/1652 |
| 10,527,877 B2* | 1/2020 | Ochi | ............... | H04M 1/0266 |
| 10,671,123 B2* | 6/2020 | Bang | ............... | G02F 1/13452 |
| 10,725,502 B2* | 7/2020 | Hirakata | ............... | G09G 5/14 |
| 2008/0223708 A1* | 9/2008 | Joo | ............... | G06F 1/1643 |
| | | | | 200/600 |
| 2012/0281380 A1* | 11/2012 | Werner | ............... | G06F 1/1637 |
| | | | | 361/807 |
| 2013/0002133 A1* | 1/2013 | Jin | ............... | G06F 1/1652 |
| | | | | 313/511 |
| 2016/0140917 A1* | 5/2016 | Hyung | ............... | G09G 3/3648 |
| | | | | 345/694 |
| 2017/0118849 A1* | 4/2017 | Kim | ............... | H04M 1/0266 |
| 2017/0331071 A1* | 11/2017 | Han | ............... | G02B 5/0263 |
| 2018/0138442 A1* | 5/2018 | Kim | ............... | G06F 3/041 |
| 2018/0184531 A1* | 6/2018 | Seo | ............... | G06F 3/0488 |
| 2018/0368270 A1* | 12/2018 | Seo | ............... | H01L 51/524 |
| 2019/0018275 A1* | 1/2019 | Ochi | ............... | H04M 1/0266 |
| 2019/0059164 A1* | 2/2019 | Hassemer | ............... | H05K 3/32 |
| 2020/0196496 A1* | 6/2020 | Shin | ............... | H05K 9/0054 |

FOREIGN PATENT DOCUMENTS

| | | |
|---|---|---|
| KR | 1020170040433 A | 4/2017 |
| KR | 101750009 A | 6/2017 |
| KR | 1020190052187 A | 5/2019 |

* cited by examiner

DISPLAY DEVICE AND METHOD OF MANUFACTURING THE SAME

This application claims priority to Korean Patent Application No. 10-2018-0003527, filed on Jan. 10, 2018, and all the benefits accruing therefrom under 35 U.S.C. § 119, the content of which is incorporated herein by reference in its entirety.

BACKGROUND

1. Field

Embodiments of the invention relates to a display device and a method of manufacturing the same.

2. Description of the Related Art

With the development of multimedia, display devices are becoming increasingly important. Accordingly, various types of display devices such as liquid crystal displays and organic light emitting displays are being used.

Of these display devices, liquid crystal displays are one of the most widely used types of flat panel displays. A liquid crystal display includes a pair of substrates having field generating electrodes, such as pixel electrodes and a common electrode, and a liquid crystal layer interposed between the two substrates. In the liquid crystal display, voltages are applied to the field generating electrodes to generate an electric field in the liquid crystal layer. The electric field determines orientations of liquid crystal molecules in the liquid crystal layer and controls polarization of incident light. Accordingly, an image is displayed by the liquid crystal display.

In addition, organic light emitting displays display images using an organic light emitting diode that generates light through recombination of electrons and holes. Such organic light emitting displays have the advantages of relatively fast response speed, high luminance, wide viewing angle and low power consumption.

These display devices have an expanded scope of application not only being used in televisions ("TVs") and mobile devices but also in wearable devices such as smart watches.

SUMMARY

One or more embodiment of the invention provides a display device including a cover panel which is uniformly attached to a display panel.

One or more embodiment of the invention also provide a method of manufacturing a display device, the method being employed to prevent creases from being formed in a cover panel.

However, embodiments of the invention are not restricted to the one set forth herein. The above and other features of the invention will become more apparent to one of ordinary skill in the art to which the invention pertains by referencing the detailed description of the invention given below.

According to an embodiment of the invention, there is provided a display device including: a display panel which is curved and displays an image; a cover window which is disposed on a front surface of the display panel at which the image is displayed; and a cover panel which is curved and disposed on a curved back surface of the display panel opposite to the front surface thereof. The cover panel is defined by a flat cover panel which is curved by attachment thereof to the curved back surface of the display panel, and the flat cover panel which is curved to define the cover panel includes a cutout portion therein recessed from an outer edge of the flat cover panel toward a center of the flat cover panel.

In addition, the cutout portion may include a first side extending from the outer edge of the flat cover panel toward the center of the flat cover panel, a second side extending from the outer edge of the flat cover panel toward the center of the flat cover panel, the second side spaced apart from the first side along the outer edge of the flat cover panel, and a point of contact at which the first and second sides meet proximate to the center of the flat cover panel.

In addition, the point of contact and the center may be spaced apart from each other.

In addition, the point of contact and the center may coincide with each other.

In addition, the display panel may further include a display area at which the image is displayed, and a non-display area which surrounds the display area, and the display device may further include a printed circuit board which is connected to the display panel at the non-display area thereof.

In addition, a front surface of the cover panel may face the curved back surface of the display panel and a portion of the printed circuit board may overlap a back surface of the cover panel opposite to the front surface thereof.

In addition, the cover panel may include an adhesive layer, a buffer layer, and a dehumidifying layer stacked sequentially.

In addition, each of the adhesive layer, the buffer layer and the dehumidifying layer may include a cutout portion and the cutout portions thereof may completely overlap each other.

In addition, the cutout portion may be provided in a plurality.

In addition, the cutout portions may include a first cutout portion and a second cutout portion spaced apart from each other.

In addition, the display panel may include a display area at which the image is displayed, and a non-display area which surrounds the display area. The non-display area may include a first area extending directly from the display area to define a maximum dimension of the non-display area in a first direction, and a second area which protrudes from the first area to dispose the first area between the second area and the display area, a maximum dimension of the second area in the first direction being smaller than that of the first area.

In addition, the cover panel may include a first portion corresponding to the first area of the non-display area, and a second portion which protrudes from the first portion to correspond to the second area of the non-display area. The second portion may overlap the second area.

In addition, the display device may further include a printed circuit board which is connected to the display panel and a connection portion in the second area of the non-display area, at which the printed circuit board is connected to the display panel. The second portion of the cover panel may protrude from the first area thereof to overlap the connection portion.

In addition, for the display panel, the second area having the maximum dimension smaller than that of the first area may meet the first area at a first point and a second point spaced apart from each other along the first direction, a first reference line may be defined connecting the first point and the center of the flat cover panel and a second reference line may be defined connecting the second point and the center of the flat cover panel. The first cutout portion may overlap the first reference line defined for the display panel, and the second cutout portion of the flat cover panel may overlap the second reference line defined for the display panel.

In addition, the second portion of the cover panel which protrudes from the first portion thereof to correspond to the second area of the non-display area may meet the first portion at a first point of contact and a second point of contact spaced apart from each other along the first direction.

In addition, the display panel may include a display area at which an image is displayed, and the display area may have a circular shape.

In addition, the cutout portion may have a fan shape.

According to another embodiment of the invention, there is provided a method of manufacturing a display device. The method may include: preparing a cover window attached to a display surface of a display panel which is curved and displays an image; disposing a flat cover panel including a cutout portion recessed from an outer edge of the flat cover panel toward a center thereof, on a curved back surface of the display panel; and pressing the flat cover panel to the curved back surface of the display panel to form the display device including a cover panel which is curved along the curved back surface of the display panel and the cover window attached thereto.

In addition, the pressing of the cover panel may include pressing the flat cover panel by rotating a pressure roll in a clockwise direction or a counterclockwise direction about the center of the flat cover panel.

In addition, the pressing of the cover panel may include disposing the flat cover panel between the curved back surface of the display panel and a domed pressure pad, and with the flat cover panel between the curved back surface of the display panel and the domed pressure pad, moving the domed pressure pad toward the display panel.

BRIEF DESCRIPTION OF THE DRAWINGS

These and/or other features will become apparent and more readily appreciated from the following description of the embodiments, taken in conjunction with the accompanying drawings in which:

FIG. 6b is a cross-sectional view of FIG. 6a;

DETAILED DESCRIPTION

Figure 1:
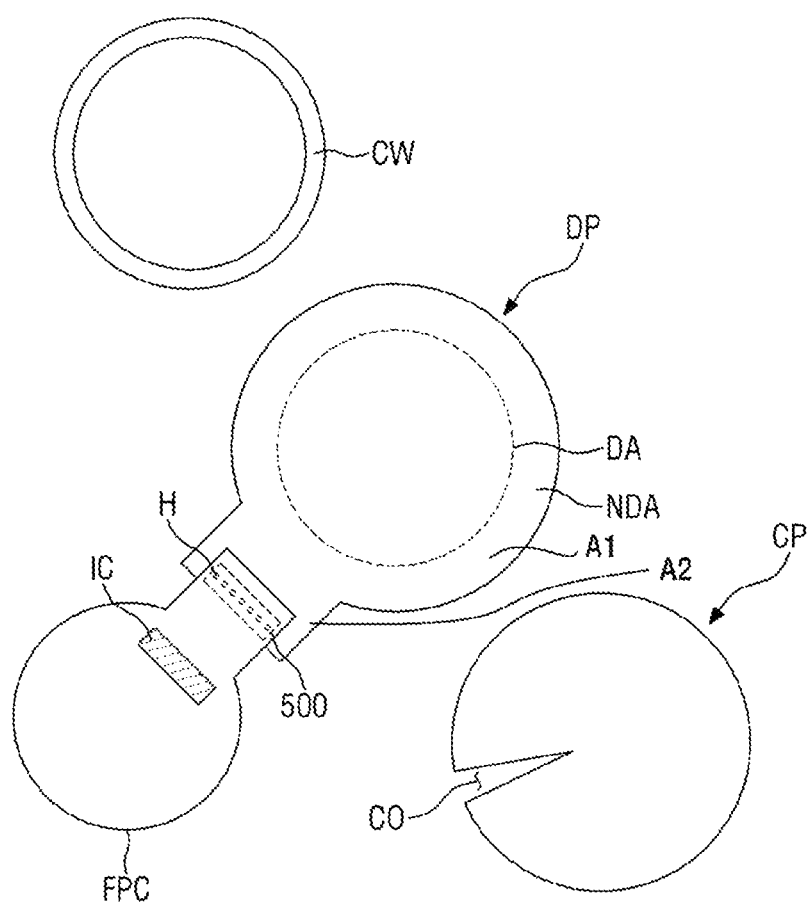
FIG. 1 is an exploded perspective view of an embodiment of a display device according to the invention.

The advantages and features of the invention and methods for achieving the advantages and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. In the entire description of the invention, the same drawing reference numerals are used for the same elements across various figures.

Although the terms "first," "second" and so forth are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

FIG. 1 is an exploded perspective view of an embodiment of a display device according to the invention.

Figure 2:
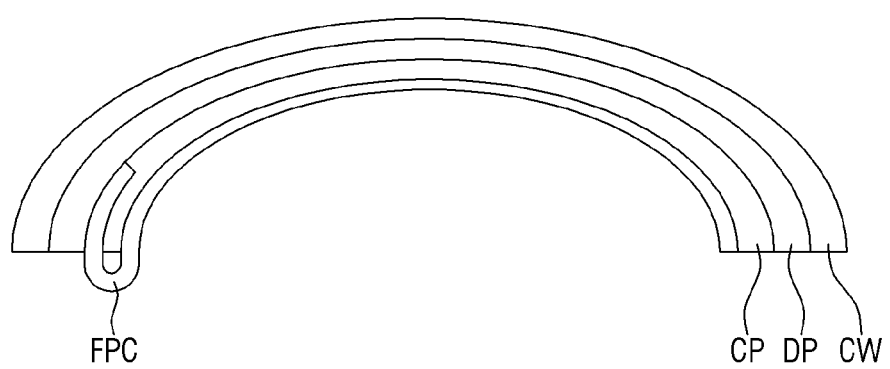
FIG. 2 is a cross-sectional view of the display device of FIG. 1.
Figure 3:
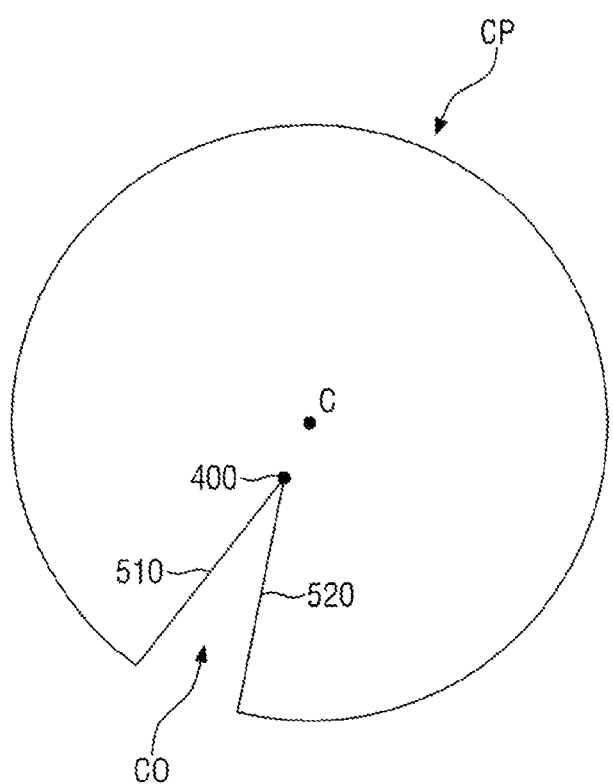
FIG. 3 is a top plan view of an embodiment of a cover panel of the display device of FIG. 1.
Figure 4:
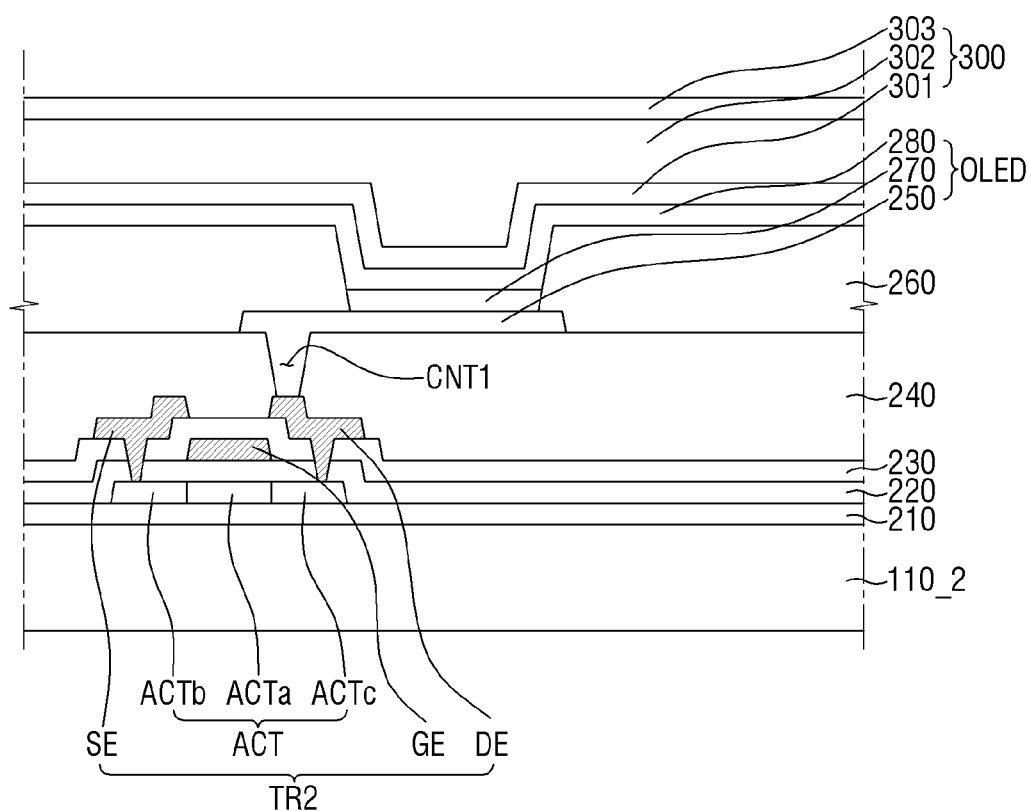
FIG. 4 is a partial cross-sectional view of the display device of FIG. 1.

FIG. 2 is a cross-sectional view of the display device of FIG. 1. FIG. 3 is a top plan view of an embodiment of a cover panel of the display device of FIG. 1. FIG. 4 is a partial cross-sectional view of the display device of FIG. 1.

Referring to FIGS. 1 through 4, the display device according to the embodiment includes a display panel DP including a display area DA, a cover window CW disposed on a front surface of the display panel DP, and a cover panel CP disposed on a back surface of the display panel DP which is opposite to the front surface thereof.

The display device and components thereof may be disposed in a plane defined by first and second directions crossing each other. The first and second directions in FIG. 1 and FIG. 3 may be any two directions crossing each other along the page. A thickness of the display device and components thereof may be taken in a third direction crossing each of the first and second directions. In FIG. 2 and FIG. 4, the thickness direction is the vertical direction, while the first and/or second direction is the horizontal direction.

The display panel DP may display an image. The display panel DP may display an image with light. In an embodiment, the display panel DP may be a self-emissive display device such as an organic light emitting display including an organic light emitting diode which generates and emits light for displaying an image. The organic light emitting diode will be described in detail later. In another embodiment, the display panel DP may be a display panel which is not self-emissive and to which light is provided from outside to display an image.

In an embodiment, the display panel DP may be a flexible display panel that can be bent, folded or rolled. That is, a curved display panel DP may include a flat display panel which is curved without being limited thereto.

The display panel DP may include the display area DA and a non-display area NDA which is disposed outside the display area DA.

The display area DA may be an area at which an image is displayed. As will be described later in detail, in an embodiment, a plurality of organic light emitting diodes may be disposed in the display area DA. The non-display area NDA may be an area at which an image is not displayed.

In an embodiment, the display panel DP may be a display panel applied to a smart watch or a wearable device. Therefore, the display panel DP may have a three-dimensional shape suitable for a smart watch or a wearable device. In an embodiment, for example, the display area DA may have a circular planar shape. In other words, the planar shape of the display area DA may be circular.

However, the shape of the display area DA is not limited to the circular shape, and the display area DA can have a quadrilateral planar shape or a planar shape including a straight line and a curve.

In an embodiment, the display area DA may include a pixel provided in plurality with which the image is displayed and/or light is emitted to display the image. The display panel DP will hereinafter be described with reference to FIG. 4. In an embodiment, the display panel DP may include a first (base) substrate 110_2. The first substrate 110_2 may be an insulating substrate and may include glass, plastic or the like.

A buffer layer 210 may be disposed on a front surface of the first substrate 110_2. The buffer layer 210 may reduce or effectively prevent the penetration of moisture and oxygen from outside the display panel DP through the first substrate 110_2. In addition, the buffer layer 210 may planarize the surface of the first substrate 110_2. In an embodiment, the buffer layer 210 may include any one of a silicon nitride (SiNx) film, a silicon oxide ($SiO_2$) film and a silicon oxynitride (SiOxNy) film. The buffer layer 210 can be omitted depending on the type of the first substrate 110_2 and/or process conditions in manufacturing the display device.

A semiconductor layer including a semiconductor pattern ACT may be disposed on the buffer layer 210. The semiconductor layer will be described based on the semiconductor pattern ACT. In an embodiment, the semiconductor pattern ACT may include or be made of a combination of one or two or more of polycrystalline silicon, monocrystalline silicon, low temperature polycrystalline silicon, amorphous silicon and an oxide semiconductor. The semiconductor pattern ACT may include, in an embodiment, a channel region ACTa not doped with an impurity, and a source region ACTb and a drain region ACTc each doped with an impurity. The source region ACTb is located on a first side of the channel region ACTa and is electrically connected to a source electrode SE to be described later. The drain region ACTc is located on a second other side of the channel region ACTa opposite to the first side thereof and is electrically connected to a drain electrode DE to be described later.

A first insulating layer 220 may be disposed on the semiconductor layer including the semiconductor pattern ACT. The first insulating layer 220 may be a gate insulating layer in an embodiment. The first insulating layer 220 may include or be made of any one or a combination of one or more of inorganic insulating materials such as silicon oxide (SiOx) and silicon nitride (SiNx) and organic insulating materials such as benzocyclobutene ("BCB"), acrylic materials and polyimide.

A gate conductor including a gate electrode GE may be disposed on the first insulating layer 220. The gate electrode GE may overlap the semiconductor pattern ACT. The gate conductor may include any one or more of aluminum (Al)-based metal including aluminum alloys, silver (Ag)-based metal including silver alloys, copper (Cu)-based metal including copper alloys, molybdenum (Mo)-based metal including molybdenum alloys, chromium (Cr), titanium (Ti) and tantalum (Ta). The gate conductor may further include a gate (signal) line which is connected to the gate electrode GE or a portion of which forms the gate electrode GE.

A second insulating layer 230 may be disposed on the gate conductor including the gate electrode GE. The second insulating layer 230 may include or be made of any one or a combination of one or more of inorganic insulating materials such as silicon oxide (SiOx) and silicon nitride (SiNx) and organic insulating materials such as benzocyclobutene (BCB), acrylic materials and polyimide.

A data conductor including the source electrode SE and the drain electrode DE may be disposed on the second insulating layer 230. The source electrode SE and the drain electrode DE are disposed on the second insulating layer 230 to be spaced apart from each other. The data conductor may include one or more of a metal, an alloy, a metal nitride, a conductive metal oxide and a transparent conductive material. In an embodiment, the data conductor may have a single film structure or a multi-film structure including of one or more of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se) and tantalum (Ta). In addition, the source electrode SE and the drain electrode DE may include or be made of an alloy of any one of the above metals and one or more elements selected from titanium (Ti), zirconium (Zr), tungsten (W), tantalum (Ta), niobium (Nb), platinum (Pt), hafnium (Hf), oxygen (O) and nitrogen (N). The data conductor may further include a data (signal) line which is connected to the source and/or drain electrode SE and DE or a portion of which forms the source and/or drain electrode SE and DE.

The semiconductor pattern ACT, the gate electrode GE, the source electrode SE and the drain electrode DE described above constitute a switching element TR2 (e.g., a thin film transistor). In FIG. 4, the switching element TR2 is illustrated as a top gate type. However, the switching element TR2 is not limited to the top gate type. That is, the switching element TR2 can be formed as a bottom gate type.

A planarization layer 240 may be disposed on the data conductor. The planarization layer 240 may remove a step difference formed by underlying layers thereto, thereby increasing the luminous efficiency of a pixel electrode 250 and an organic light emitting layer 270 which will be described later. The planarization layer 240 may include an organic material in an embodiment. In an embodiment, for example, the planarization layer 240 may include any one or more of polyimide, polyacryl and polysiloxane. In an embodiment, the planarization layer 240 may include an inorganic material or a combination of an inorganic material and an organic material. A first contact hole CNT1 may be defined in and/or by the planarization layer 240 to expose at least a part of the drain electrode DE.

The pixel electrode 250 may be disposed on the planarization layer 240. At the first contact hole CNT1, the pixel electrode 250 may be electrically connected to the drain electrode DE exposed by the first contact hole CNT1. That is, the pixel electrode 250 may be an anode which is a hole injection electrode. When formed as an anode, the pixel electrode 250 may include a material having a relatively high work function in order to facilitate hole injection. In addition, the pixel electrode 250 may be a reflective electrode, a transflective electrode or a transmissive electrode. The pixel electrode 250 may include a reflective material in an embodiment. In an embodiment, the reflective material may include one or more of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In) and magnesium-silver (Mg—Ag).

The pixel electrode 250 may be formed as a single film in an embodiment. Alternatively, the pixel electrode 250 may be formed as a multi-layer film in which two or more materials are stacked.

When formed as a multi-layer film, the pixel electrode 250 may include, in an embodiment, a reflective film and a transparent or translucent electrode which is disposed on the reflective film. In an embodiment, the pixel electrode 250 may include a reflective film and a transparent or translucent electrode which is disposed under the reflective film. In an embodiment, for example, the pixel electrode 250 may have a three-layer structure of indium tin oxide ("ITO")/Ag/ITO.

Here, the transparent or translucent electrode may include or be made of one or more of indium tin oxide ("ITO"), indium zinc oxide ("IZO"), zinc oxide ("ZnO"), indium oxide ($In_2O_3$), indium gallium oxide ("IGO") and aluminum zinc oxide ("AZO").

A pixel defining layer 260 may be disposed on the pixel electrode 250. The pixel defining layer 260 includes an opening that at least partially exposes the pixel electrode 250. The pixel defining layer 260 may include an organic material or an inorganic material. In an embodiment, the pixel defining layer 260 may include a material such as photoresist, polyimide resin, acrylic resin, a silicon compound or polyacrylic resin.

The organic light emitting layer 270 may be disposed on the pixel electrode 250 and the pixel defining layer 260. More specifically, the organic light emitting layer 270 may be disposed at an area of the pixel electrode 250 which is exposed through the opening of the pixel defining layer 260. In an embodiment, the organic light emitting layer 270 may at least partially cover sidewalls of the pixel defining layer 260 at the opening thereof.

In an embodiment, the organic light emitting layer 270 may generate and/or emit light of one of red, blue and green colors. In an embodiment, the organic light emitting layer 270 may generate and/or emit white light or emit light of one of cyan, magenta and yellow colors. When the organic light emitting layer 270 emits white light, a white light emitting material or a stack of a red light emitting layer, a green light emitting layer and a blue light emitting layer may be included therein.

A common electrode 280 may be disposed on the organic light emitting layer 270 and the pixel defining layer 260. The common electrode 280 may be disposed or formed on the entire surface of the organic light emitting layer 270 and the pixel defining layer 260 in an embodiment, to be common to each of these layers and to more than one pixel in the display area DA. The common electrode 280 may be a cathode in an embodiment. In an embodiment, the common electrode 280 may include one or more of Li, Ca, Lif/Ca, LiF/Al, Al, Ag and Mg. In addition, the common electrode 280 may include or be made of a material having a relatively low work function. The common electrode 280 may be, in an embodiment, a transparent or translucent electrode including any one or more of indium tin oxide ("ITO"), indium zinc oxide ("IZO"), zinc oxide ("ZnO"), indium oxide ($In_2O_3$), indium gallium oxide ("IGO") and aluminum zinc oxide ("AZO").

The pixel electrode 250, the organic light emitting layer 270 and the common electrode 280 described above may together constitute an organic light emitting diode OLED. However, the organic light emitting diode OLED is not limited to this configuration and may be a multilayer structure further including a hole injection layer ("HIL"), a hole transport layer ("HTL"), an electron transport layer ("ETL") and an electron injection layer ("EIL").

An encapsulation layer 300 may be formed on the common electrode 280 disposed on the first substrate 110_2.

The encapsulation layer 300 may reduce or effectively prevent moisture and air that can be introduced from outside the display panel DP from penetrating into the organic light emitting diode OLED. The encapsulation layer 300 may include a first inorganic layer 301, an organic layer 302 and a second inorganic layer 303 in an embodiment.

The first inorganic layer 301 may be disposed on and closest to the common electrode 280. The first inorganic layer 301 may include any one or more of silicon oxide (SiOx), silicon nitride (SiNx) and silicon oxynitride (SiONx).

The organic layer 302 may be disposed on the first inorganic layer 301. The organic layer 302 may include any one or more of epoxy, acrylate, and urethane acrylate. The organic layer 302 may planarize a step difference formed by the pixel defining layer 260.

The second inorganic layer 303 may be disposed on the organic layer 302. The second inorganic layer 303 may include any one or more of silicon oxide (SiOx), silicon nitride (SiNx) and silicon oxynitride (SiONx).

In FIG. 4, each of the first inorganic layer 301, the organic layer 302 and the second inorganic layer 303 is illustrated as a single layer. However, embodiments are not limited to this case. That is, at least one of the first inorganic layer 301, the organic layer 302 and the second inorganic layer 303 may be formed in a multilayer structure.

In an embodiment, the encapsulation layer 300 may include a hexamethyldisiloxane ("HMDSO") layer. More specifically, the encapsulation layer 300 may include a first inorganic layer 301, a second inorganic layer 303 and an HMDSO layer disposed between the first inorganic layer 301 and the second inorganic layer 303. That is, the above-described organic layer 302 can be replaced with the HMDSO layer.

In an embodiment of a method of forming a display device, the HMDSO layer may be formed after the formation of the first inorganic layer 301 in the same chamber in which the first inorganic layer 301 was formed. Thus, the process of forming the encapsulation layer 300 can be simplified. In addition, the encapsulation layer 300 can have sufficient flexibility by including the HMDSO layer that can absorb stress.

While a case where the encapsulation layer 300 is disposed or formed on the common electrode 280 has been described above, embodiments are not limited to this case.

In an embodiment, a second substrate (not illustrated) facing the first substrate 110_2 may be disposed on the common electrode 280.

The layers of the first substrate 110_2 through the encapsulation layer 300 (or the second substrate if provided) may be collectively referred to as a display substrate, a display panel and/or a display device.

Referring again to FIG. 1, the non-display area NDA may be disposed outside the display area DA. In the non-display area NDA, various (conductive) signal lines through which power, data, control and/or driving signals necessary for the display area DA to display an image may be disposed.

A connection portion 500 may be disposed in the non-display area NDA at a side thereof. A pad provided in plurality electrically connected to the various signal lines may be disposed in the connection portion 500.

In an embodiment, the connection portion 500 may be disposed on the back surface of the display panel DP. As described above, the organic light emitting diode OLED may be disposed on the front surface of the display panel DP.

In order to electrically connect the organic light emitting diode OLED and the signal lines each disposed on the front surface of the display panel DP to the pads disposed on the back surface of the display panel DP, the display panel DP may include a plurality of through holes H connecting the back surface and the front surface of the display panel DP. That is, an inner area of the through holes H may be exposed at both the back surface and front surface of the display panel DP.

That is, components at the front surface of the display panel DP and the back surface of the display panel DP may be electrically connected to each other via the through holes H. To this end, the through holes H may be filled with a conductive material. That is, the components at the front surface of the display panel DP and the back surface of the display panel DP may be electrically connected to each other by the conductive material at the through holes H.

In an embodiment, the non-display area NDA may include or be divided into a first area A1 surrounding the display area DA (e.g., disposed at all sides thereof) and a second area. A2 which protrudes from the first area A1. The second area A2 may protrude outward from the first area A1. The second area A2 may be narrower than the first area A1. Referring to FIG. 1, for example, the non-display area NDA which surrounds the display area DA includes the first area A1 extending directly from the display area DA to define a maximum dimension of the non-display area NDA in a first direction (e.g., parallel to a length of the connection portion 500). The second area A2 which protrudes from the first area A1 disposes the first area A1 between the second area A2 and the display area DA such that a maximum dimension of the second area A2 in the first direction (e.g., parallel to the length of the connection portion 500) is smaller than that of the first area A1.

In an embodiment, the connection portion 500 may be formed at the second area A2.

The display device according to the embodiment may further include a flexible printed circuit board FPC.

The flexible printed circuit board. FPC may generate a signal necessary for driving the display area DA and transmit the generated signal to the display area DA.

To this end, a driver integrated circuit ("IC") for generating a driving signal may be disposed on the flexible printed circuit board FPC.

The flexible printed circuit board FPC may have flexibility. Accordingly, the flexible printed circuit board FPC can be bent and folded. That is, a deformed flexible printed circuit board may include a flat flexible printed circuit board which is curved without being limited thereto.

In an embodiment, the planar shape of the flexible printed circuit board FPC may include a circular shape. In an embodiment, the flexible printed circuit board FPC may be folded back, such as along layers of the display device, to overlap the display area DA in a top plan view.

The flexible printed circuit board FPC and the connection portion 500 may be electrically connected to each other. In an embodiment, the flexible printed circuit board FPC and the connection portion 500 may be electrically connected by an anisotropic conductive film ("ACF") interposed between them.

Referring to FIGS. 1 and 2, the cover window CW may be disposed on the front (e.g., display) surface of the display panel DP at which an image is displayed. The cover window CW may define the front surface of the overall display device, at a viewing side thereof. FIG. 1 and FIG. 3 may each represent a flat version of each of the display panel DP, cover window CW, cover panel CP and flexible printed circuit board FPC which is curved or deformed to form a curved version thereof.

The cover window CW may cover the front surface of the display panel DP. In an embodiment, the cover window CW may include or be made of glass or plastic.

In an embodiment, the planar shape of the cover window CW may be circular. That is, the cover window CW may have a circular shape corresponding to the circular shape of the display panel DP.

However, the shape of the cover window CW is not limited to the circular shape. When the display panel DP has a different shape as described above, the cover window CW may also have a different shape corresponding to the shape of the display panel DP.

As illustrated in FIG. 2, the cover window CW may include a curved surface. That is, in an assembled display device, the cover window CW may have an upwardly convex parabolic shape in cross-section.

In other words, the cover window CW may be shaped like an upwardly convex dome.

An image generated at the display area DA of the display panel DP can be provided to a user through the cover window CW at a viewing or front side of the display device.

Referring again to FIG. 2, when the cover window CW has an upwardly convex dome shape, the display panel DP may be bent along the shape of an inner curved surface of the cover window CW so that the display panel DP has a curved surface. That is, a curved display panel may include a flat display panel which is curved along the curved cover window CW without being limited thereto.

That is, as the display panel DP and the cover window CW are attached to each other, the display panel DP may be at least partially bent to contact the cover window CW.

Referring to FIGS. 1 and 2, the cover panel CP may be disposed on the back surface of the display panel DP.

The cover panel CP may be attached to the back surface of the display panel DP and reduce impact applied to the display panel DP. In addition, the cover panel CP may dissipate heat generated in the display panel DP and/or may block moisture incident thereto.

In an embodiment, the planar shape of the cover panel CP may be circular. When the display panel DP has a circular shape as described above, the cover panel CP may also have a circular shape to cover the display panel DP.

In an embodiment, the cover panel CP may include a cutout portion CO at which material of the cover panel CP is absent. The cutout portion CO may be otherwise referred to as a notch or recess in the cover panel CP. The cutout portion CO may be defined in a flat cover panel which is bent or curved to form a curved cover panel.

The cutout portion CO may include a portion of the cover panel CP which has been removed extended from a circumference (e.g., an outer edge) of the cover panel CP toward the inside of the cover panel CP. Accordingly, the cutout portion CO may have a fan or wedge shape in the top plan view.

The cutout portion CO will now be described in detail with reference to FIG. 3.

In an embodiment, the cutout portion CO may include or be defined by a first side 510, a second side 520 and a point of contact 400 at which the first and second sides 510 and 520 meet each other at an inside of the cover panel CP shape.

The first side 510 and the second side 520 may extend from the circumference (e.g., the outer edge) of the cover panel CP toward a center C of the cover panel CP. The center C of the cover panel CP coincides with a center of a flat cover panel which forms the cover panel CP.

Here, the center C of the cover panel CP may denote a geometric center of the cover panel CP. If the cover panel CP has a circular shape, the center C may be a center of a circle. The circumference of the display panel DP at a boundary between the first and second areas A1 and A2 may extend in a curve continued from the outer edge of the first area A1, without being limited thereto.

An outer end of the first side 510 and an outer end of the second side 520 at the outer edge of the cover panel CP may be spaced apart from each other. An inner end of the first side 510 and an inner end of the second side 520 opposite to the outer ends thereof, may be in contact with each other. That is, at the point of contact 400, the inner end of the first side 510 and the inner end of the second side 520 may meet each other.

In an embodiment, the point of contact 400 may be spaced apart from the center C in the top plan view. A curved cover panel may include a flat cover panel which is curved without being limited thereto. When the cover panel CP disposed in a flat state is attached to the display panel DP having a curved surface, creases may be formed due to a geometrical mismatch. These creases are particularly noticeable in the vicinity of the center and the outer edge of the cover panel CP.

The cutout portion CO defined or formed in the flat cover panel which is curved to form the cover panel CP can compensate for this geometric mismatch to some extent. In other words, since the cutout portion CO eliminates some of the stress that forms creases, the formation of creases can be reduced or effectively prevented.

Referring again to FIG. 2, the cover panel CP may be attached to the back surface of the display panel DP. When the display panel DP has a curved surface, the cover panel CP may be bent along the shape of an inner curved surface of the display panel DP so that the cover panel CP has a curved surface.

Creases may be formed in the process of closely attaching the cover panel CP to the display panel DP. However, the cutout portion CO defined or formed in the cover panel CP can reduce or effectively prevent the formation of creases as described above.

In an embodiment, the printed circuit board FPC may be disposed on a back surface of the cover panel CP.

In an embodiment, the printed circuit board FPC may be folded back along a thickness of the cover panel CP while being connected to the display panel DP. Accordingly, the cover panel CP may be disposed between a portion of the printed circuit board FPC and the display panel DP along a thickness direction of the display device.

In other words, a front surface of the cover panel CP may be attached to (a back surface of) the display panel DP, and the back surface of the cover panel CP may be attached to (a front surface of) the printed circuit board FPC.

Hereinafter, display devices according to other modified embodiments will be described. Some of the elements described below may be substantially the same as those of the display device according to the above-described embodiment, and thus a description thereof will be omitted in order to avoid redundancy.

Figure 5:
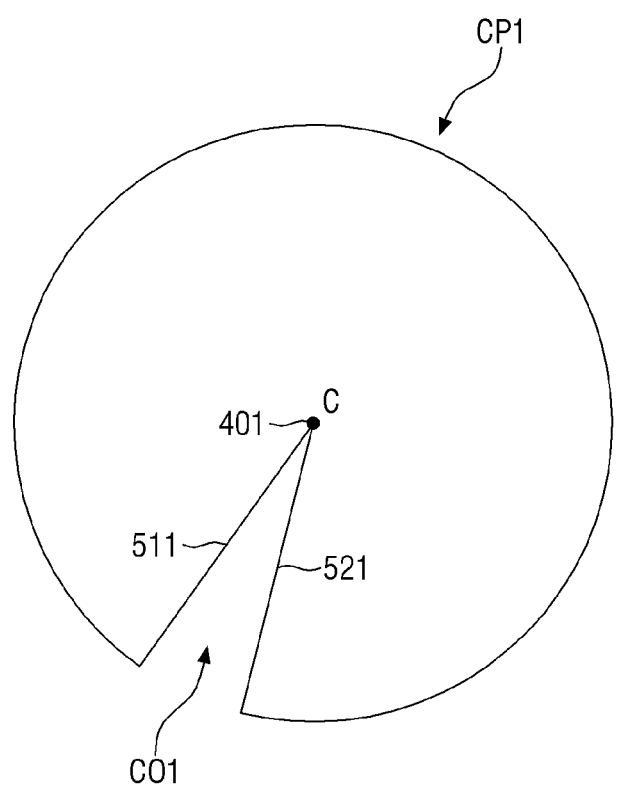
FIG. 5 is a top plan view of a modified embodiment of a cover panel of a display device according to the invention.

FIG. 5 is a top plan view of a modified embodiment of cover panel of a display device according to the invention.

Referring to FIG. 5, in an embodiment, a point of contact 401 of a cutout portion CO1 of a cover panel CP1 may overlap a center C thereof to coincide or be aligned with the center C.

The cutout portion CO1 may include a first side 511, a second side 521 and the point of contact 401 at which the first side 511 and the second side 521 meet each other.

The first side 511 and the second side 521 may extend from a circumference (e.g., an outer edge) of the cover panel CP1 toward the center C.

That is, an outer end of the first side 511 and an outer end of the second side 521 are spaced apart from each other, but the inner end of the first side 511 and the inner end of the second side 521 opposite to the outer ends thereof may contact each other at the center C.

That is, the point of contact 401 between the first side 511 and the second side 521 may overlap the center C to be aligned therewith. In other words, the point of contact 401 of the first side 511 and the second side 521 may be the center C of the cover panel CP1.

Figure 6A:
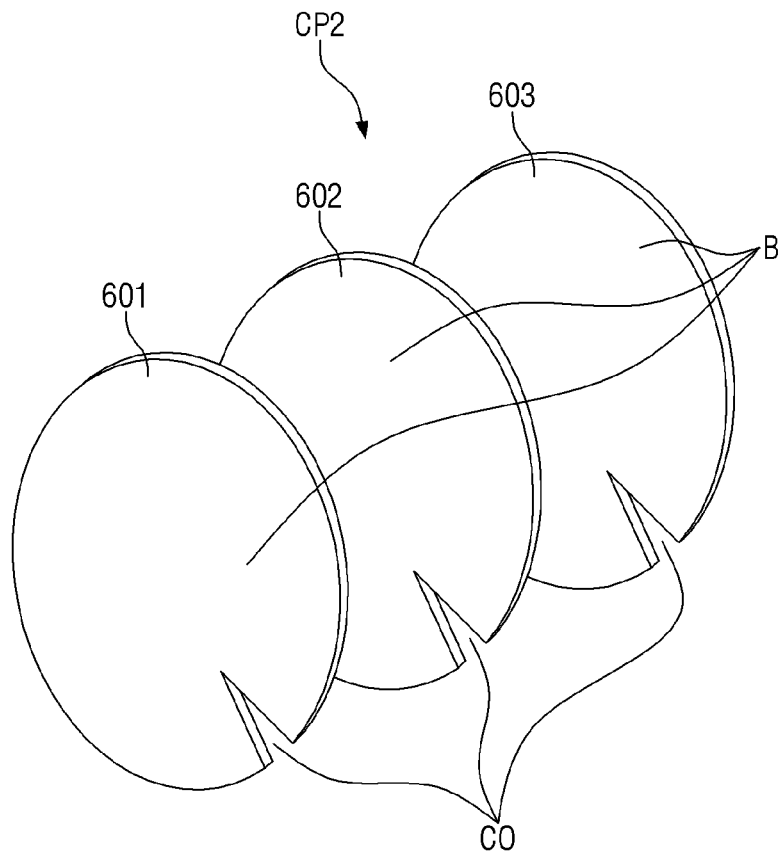
FIG. 6a is an exploded perspective view of another embodiment of a cover panel of a display device according to the invention.

FIG. 6a is an exploded perspective view of another embodiment of a cover panel of a display device according to the invention.

Figure 6B:
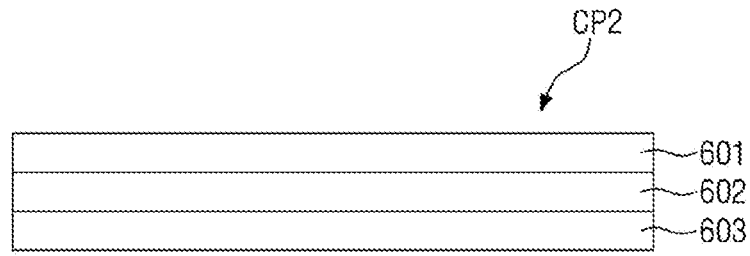

FIG. 6b is a cross-sectional view of FIG. 6a.

Referring to FIGS. 6a and 6b, in an embodiment, a cover panel CP2 may include an adhesive layer 603, a buffer layer 602 and a dehumidifying layer 601.

In an embodiment, the cover panel CP2 may have a structure in which a plurality of functional layers is stacked.

The dehumidifying layer 601 may be a layer that contacts a display panel DP in an assembled structure of a display device such as described above with reference to FIG. 2. The dehumidifying layer 601 may function to absorb moisture to reduce or effectively prevent the moisture from penetrating into the display panel DP from outside thereof.

To this end, the dehumidifying layer 601 may include, for example, a sponge.

The buffer layer 602 may be disposed on a back surface of the dehumidifying layer 601. The buffer layer 602 may absorb impact thereto. That is, the buffer layer 602 may reduce or effectively prevent external impact from being transmitted to the display panel DP.

In an embodiment, the buffer layer 602 may include polymer resin, rubber, a urethane-based material or an acrylic-based material.

The adhesive layer 603 may be disposed on a back surface of the buffer layer 602. In an embodiment, the adhesive layer 603 may include adhesive resin.

In an embodiment, the adhesive layer 603 may be a double-sided tape.

The adhesive layer 603 may bond a printed circuit board FPC and the cover panel CP2 together.

The printed circuit board FPC may be disposed on a back surface of the cover panel CP2 as described above with reference to FIG. 2.

When the cover panel CP2 includes the adhesive layer 603, the cover panel CP2 and the printed circuit board FPC may be bonded to each other by the adhesive layer 603.

The adhesive layer 603, the buffer layer 602 and the dehumidifying layer 601 may have the same planar shape as each other. Outer and inner edges of each of these layers may be aligned with each other within the collective cover panel CP2. That is, the adhesive layer 603, the buffer layer 602, and the dehumidifying layer 601 may have the same shape and completely overlap each other.

Each of the adhesive layer 603, the buffer layer 602 and the dehumidifying layer 601 may include a cutout portion CO defined or formed at the same position as each other. The cutout portions CO may have the same planar shape as each other. The cutout portions CO may completely overlap each other to form a collective cutout portion of the cover panel CP2.

Figure 7:
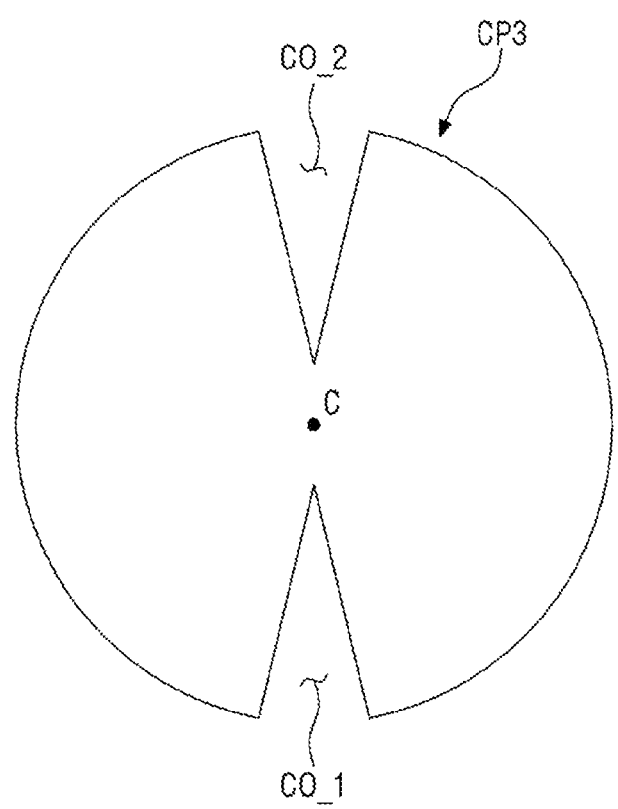
FIG. 7 is a top plan view of another modified embodiment of a cover panel of a display device according to the invention.

FIG. 7 is a top plan view of another modified embodiment of a cover panel of a display device according to the invention.

Referring to FIG. 7, a cover panel CP3 may include a plurality of cutout portions.

In an embodiment, a plurality of cutout portions may be provided. In addition, the cutout portions may be spaced apart from each other along the outer edge and at an inner area of the cover panel CP3.

In an embodiment, the cutout portions may include a first cutout portion CO_1 and a second cutout portion CO_2. Each of the first cutout portion CO_1 and the second cutout portion CO_2 may have substantially the same shape as those of the display devices according to the previously-described embodiments. Therefore, a description of the shape of each of the first cutout portion CO_1 and the second cutout portion CO_2 will be omitted.

In an embodiment, the first cutout portion CO_1 and the second cutout portion CO_2 may be arranged to face each other. That is, the first cutout portion CO_1 and the second cutout portion CO_2 may face each other with respect to a center C interposed therebetween.

When a plurality of cutout portions are provided, the stress generated in the process of attaching the cover panel CP3 to a display panel DP can be more effectively eliminated. Accordingly, including more than one cutout portion can suppress the formation of creases.

Figure 8:
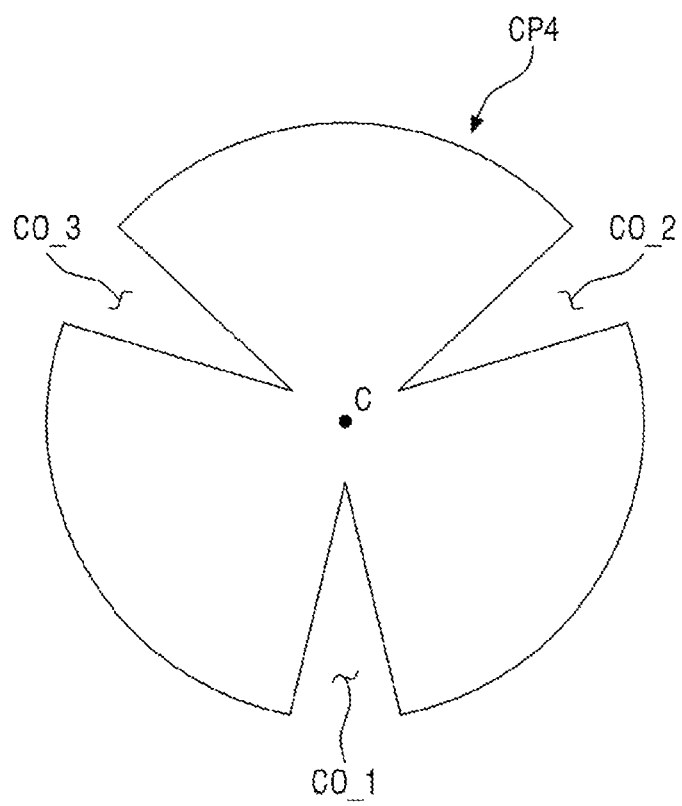
FIG. 8 is a top plan view of still another modified embodiment of a cover panel of a display device according to the invention.
Figure 9:
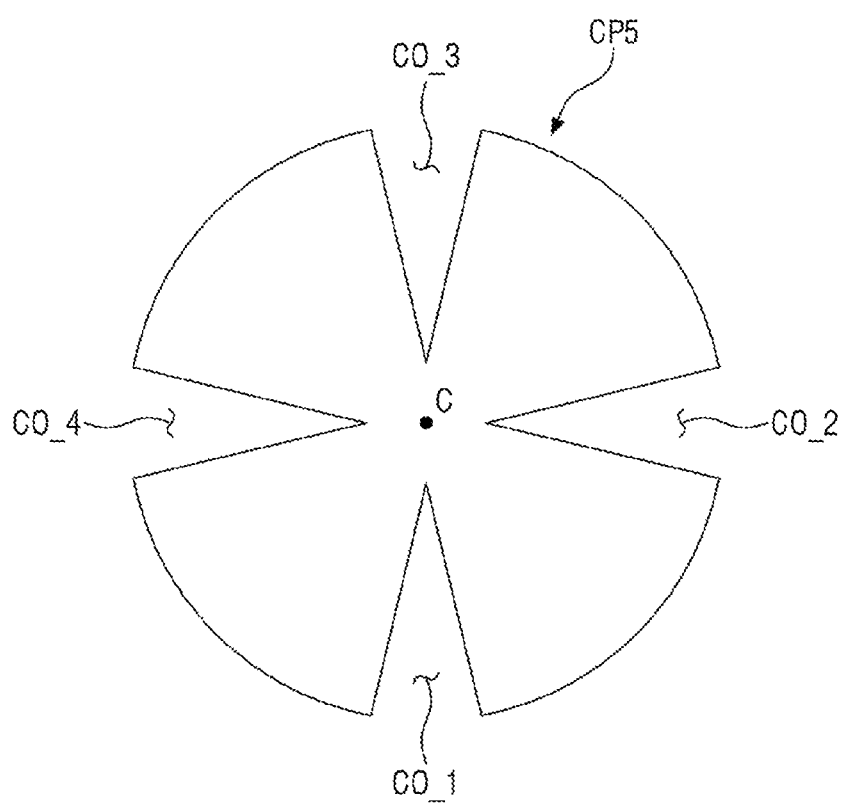
FIG. 9 is a top plan view of yet another modified embodiment of a cover panel of a display device according to the invention.

FIG. 8 is a top plan view of still another modified embodiment of a cover panel of a display device according to an embodiment. FIG. 9 is a top plan view of yet another modified embodiment of a cover panel of a display device according to the invention.

Referring to FIGS. 8 and 9, a cover panel may include three or more cutout portions. FIG. 8 shows a case where a cover panel CP4 includes a first cutout portion CO_1, a second cutout portion CO_2 and a third cutout portion CO_3, and FIG. 9 shows a case where a cover panel CP5 includes a first cutout portion CO_1, a second cutout portion CO_2, a third cutout portion CO_3 and a fourth cutout portion CO_4.

When a plurality of cutout portions are provided, the stress generated in the attachment process can be efficiently dispersed.

While three cutout portions are illustrated in FIG. 8 and four cutout portions in FIG. 9, the number of cutout portions is not limited to three or four. In other embodiments, the number of cutout portions may be four or more.

The plural cutout portions within a cover panel may be spaced apart from each other at substantially equal distances from each other without being limited thereto.

Figure 10:
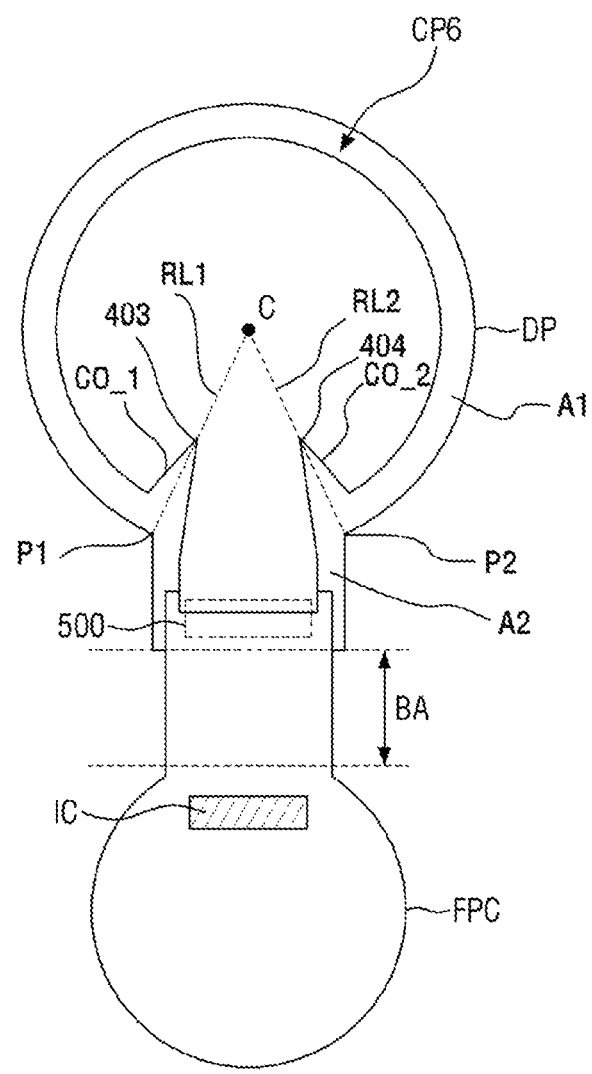
FIG. 10 is a top plan view of yet another embodiment of a display device according to the invention.

FIG. 10 is a top plan view of another embodiment of a display device according to the invention.

Referring to FIG. 10, a cover panel CP6 may include a first cutout portion CO_1 and a second cutout portion CO_2. The first and second cutout portions CO_1 and CO_2 may cooperate to form a single cutout portion of the cover panel CP6.

As described above, a display panel DP may include a second area A2 protruding in a direction from a first area A1.

Points from which the second area A2 starts may be defined in the display panel DP. For ease of description, these points will be referred to as a first point P1 and a second point P2.

The second area A2 may protrude outward from the first point P1 and the second point P2. That is, the first point P1 and the second point P2 may be a border between the first area A1 and the second area A2.

The first point P1 and the second point P2 may be spaced apart from each other.

An outer edge of the display panel DP may be continued between first point P1 and the second point P2 to define the border between the first area A1 and the second area A2. That is, in an embodiment, the outer edge of the display panel DP may extend as a continuation of the circumference to be curved at the boundary between the first and second areas A1 and A2. In another embodiment, the outer edge of the display panel DP may extend as a straight line from the first point P1 and the second point P2.

In an embodiment, the first point P1 and the second point P2 may be inflection points of the circumference of the display panel DP. That is, the circumference of the display panel DP may extend with a curvature at portions excluding the second area A2 and then extend with a different curvature from the first point P1 and the second point P2 at the second area A2.

A first reference line RL1 is defined connecting the first point P1 and a center C of the display panel DP to each other and a second reference line RL2 is defined connecting the second point P2 and the center C to each other.

The cover panel CP6 may include a main portion (e.g., substantially circular in FIG. 10) corresponding to a main portion of the display panel DP, and a protruded portion which extends from the main portion at a position corresponding to the second area A2 of the display panel DP.

In an embodiment, for the cover panel CP6, the first cutout portion CO_1 may be disposed on the first reference line RL1 defined for the display panel DP, and the second cutout portion CO_2 may be disposed on the second reference line RL2 defined for the display panel DP.

In other words, the first cutout portion CO_1 of the cover panel CP6 may overlap the first reference line RL1 defined for the display panel DP, and the second cutout portion CO_2 of the cover panel CP may overlap the second reference line RL2 defined fix the display panel DP. That is, the first and second reference lines RL1 and RL2 may extend from the center C to be disposed within a planar area defined by the first and second cutout portions CO_1 and CO_2, as illustrated in FIG. 10.

In an embodiment, to define the protruded portion of the cover panel CP6, a first point of contact 403 of the first cutout portion CO_1 may be disposed on the first reference line RL1 defined for the display panel DP and a second point of contact 404 of the second cutout portion CO_2 may be disposed on the second reference line RL2 defined for the display panel DP. The first and second points of contact 403 and 404 may be points where the main portion of the cover panel CP6 meets the protruded portion thereof.

In an embodiment, the first cutout portion CO_1 may overlap the first reference line RL1, and the second cutout portion CO_2 may overlap the second reference line RL2. However, the first point of contact 403 may be disposed outside the first reference line RL1, and the second point of contact 404 may be disposed outside the second reference line RL2.

When the display panel DP has the second area A2, creases of the cover panel CP6 are noticeable in the vicinity of the first point P1 and the second point P2. However, if the first cutout portion CO_1 and the second cutout portion CO_2 are defined corresponding to the first reference line RL1 and the second reference line RL2 as described above, the formation of creases in portions corresponding to the first point P1 and the second point P2 can be reduced or effectively prevented.

In an embodiment, protruded portion of the cover panel CP6 may partially cover the second area A2 of the display panel DP.

The cover panel CP6 covering the second area A2 may overlap a connection portion 500. Accordingly, a distal end of the protruded portion of the cover panel CP6 may at least partially overlap an end of a printed circuit board FPC at which the printed circuit board FPC is connected to the display panel DP.

The printed circuit board FPC may include a main portion (e.g., substantially circular in FIG. 10) corresponding to the main portions of the display panel DP and the cover panel CP, and a protruded portion which extends from the main portion at a position corresponding to the second area A2 of the display panel DP.

The cover panel CP6 may not overlap the bending area BA of the printed circuit board FPC. The bending area BA may refer to an area of the printed circuit board FPC which is folded or bent. That is, the bending area BA of the printed circuit board FPC may be folded or bent to be disposed on a back surface of the cover panel CP6 as described above with reference to FIG. 2. If the cover panel CP6 overlaps the bending area BA of the printed circuit board FPC, the cover panel CP6 can hinder folding of the printed circuit board FPC. Therefore, the cover panel CP6 may not overlap the bending area BA of the printed circuit board FPC.

Hereinafter, a method of manufacturing a display device according to an embodiment will now be described. Some of the elements described below may be substantially the same as those of the display devices according to the above-described embodiments, and thus a description thereof will be omitted in order to avoid redundancy.

Figure 11:
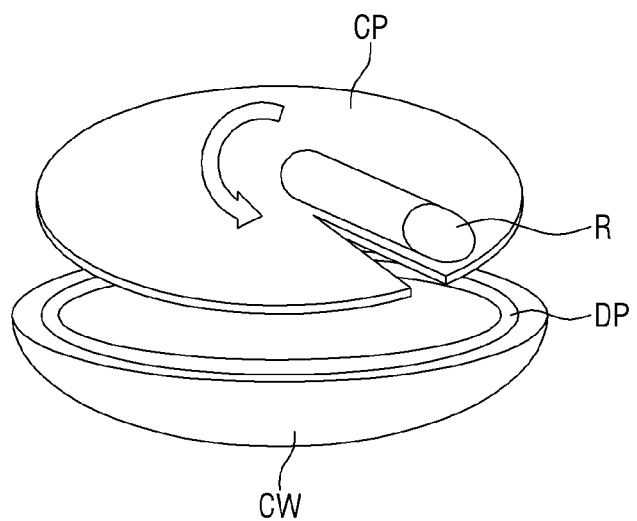
FIG. 11 is a perspective view illustrating an embodiment of a method of manufacturing a display device according to the invention.

FIG. 11 is a perspective view illustrating an embodiment of a method of manufacturing a display device according to the invention. Referring to FIG. 11, the method of manufacturing a display device according to the embodiment includes preparing a display panel DP which displays an image and a cover window CW which is attached to a front surface of the display panel DP, placing a cover panel CP which includes a cutout portion CO defined extended from a circumference of the cover panel CP toward a center of the cover panel CP, on a back surface of the display panel DP attached to the cover window CW, and pressing the cover panel CP to the display panel DP attached to the cover window CW.

The display panel DP and the cover window CW may be substantially the same as those of the display devices according to the above-described embodiments. That is, the cover window CW may have a dome shape, and accordingly, the display panel DP may include a curved surface as being attached to an inner curved surface of the cover window CW.

The placing of the cover panel CP on the back surface of the display panel DP may be performed. In detail, a flat cover panel (CP in FIG. 11) may be prepared and positioned on the back surface of the curved display panel (DP in FIG. 11). The cover panel CP may be substantially the same as those described in the above embodiments.

Referring again to FIG. 11, the pressing of the flat cover panel CP to a curved back surface of the display panel DP using a pressure roll (or roller) R may be performed.

The flat cover panel CP can be curved and attached to the display panel DP by pressing the flat cover panel CP toward the curved display panel DP using the pressure roller R. Although not illustrated in the drawing, an adhesive layer may be disposed between the flat cover panel CP and the curved display panel DP to which the flat cover panel is to be attached. Accordingly, when the flat cover panel CP is pressed, the flat cover panel CP is disposed to follow the curve of the curved display panel such that a curved cover panel CP and the curved display panel DP can be bonded to each other.

In an embodiment, the flat cover panel CP may be pressed to be curved by using the pressure roll R. In an embodiment, the pressure roll R may be shaped like a bar having a length thereof extending in a longitudinal direction. In an embodiment, the longitudinal direction may be a direction taken from the center of the flat cover panel CP to the circumference (e.g., outer edge) of the flat cover panel CP.

In an embodiment, the pressure roll R may have a length corresponding to a distance from the center C of the cover panel CP to the circumference of the cover panel CP. Such a length of the pressure roll R may allow the pressure roll R to move along the curved back surface of the display panel DP with the flat cover panel DP disposed between the pressure roll R and the display panel DP.

In an embodiment, the pressure roll R may be rotated clockwise or counterclockwise about the center C of the cover panel CP to press the cover panel CP to the curved display panel DP.

Specifically, the cover panel CP may be pressed by fixing a first end of the pressure roll R to the center C of the cover panel CP and moving a second end of the pressure roll R opposing the first end thereof along the circumference of the cover panel CP.

Figure 12:
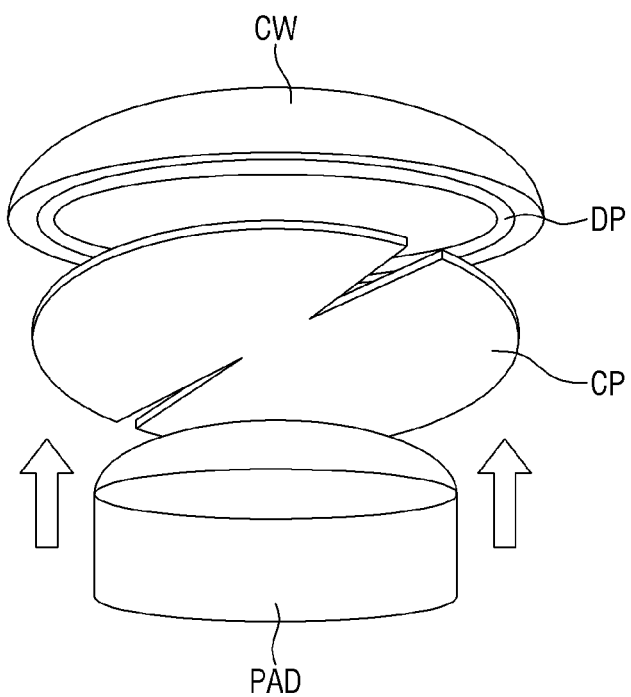
FIG. 12 is a perspective view illustrating another embodiment of a method of manufacturing a display device according to the invention.

FIG. 12 is a perspective view illustrating another embodiment of a method of manufacturing a display device according to the invention.

In an embodiment, a flat cover panel CP may be pressed to a curved display panel DP using a pressure pad PAD.

The pressure pad PAD may have an elastic material. An upper surface of the pressing pad PAD may have an upwardly convex curved surface corresponding to a dome shape of a cover window CW and/or the curved display panel DP. If the cover panel CP is pressed using this pressure pad PAD, pressure can be uniformly transmitted from a center C of the cover panel CP toward the periphery of the cover panel CP.

Accordingly, the cover panel CP and a display panel DP can be uniformly bonded to each other to each have a curved shape.

As described above, when the cover window CW has a dome shape defining a curved shape of the display panel DP attached thereto, creases can be formed in the cover panel CP due to geometrical mismatch. If one or more cutout portions are formed in the cover panel CP as in the above-described embodiments, the stress generated in the pressing process can be eliminated, thereby reducing or effectively preventing the formation of creases in the cover panel CP.

According to one or more embodiment, it is possible to reduce or effectively prevent creases from being formed in a cover panel which is attached to a curved display panel.

However, the effects of the embodiments are not restricted to the one set forth herein. The above and other effects of the embodiments will become more apparent to one of daily skill in the art to which the embodiments pertain by referencing the claims.

What is claimed is:

1. A display device comprising:
    a display panel which is curved and displays an image;
    a cover window which is disposed on a front surface of the display panel at which the image is displayed; and
    a cover panel which is curved and disposed on a curved back surface of the display panel opposite to the front surface thereof,
    wherein the cover panel is defined by a flat cover panel which is curved by attachment thereof to the curved back surface of the display panel, and
    the flat cover panel which is curved to define the cover panel comprises a cutout portion therein recessed from an outer edge of the flat cover panel toward a center of the flat cover panel in a top plan view.

2. The display device of claim 1, wherein in the top plan view, the cutout portion of the flat cover panel which is curved to define the cover panel comprises:
    a first side extending from the outer edge of the flat cover panel toward the center of the flat cover panel,
    a second side extending from the outer edge of the flat cover panel toward the center of the flat cover panel, the second side spaced apart from the first side along the outer edge of the flat cover panel, and
    a point of contact at which the first and second sides meet proximate to the center of the flat cover panel.

3. The display device of claim 2, wherein in the top plan view, the point of contact of the cutout portion and the center of the flat cover panel are spaced apart from each other.

4. The display device of claim 2, wherein in the top plan view, the point of contact of the cutout portion and the center of the flat cover panel coincide with each other.

5. The display device of claim 1, wherein the display panel comprises in the top plan view:
    a display area at which the image is displayed, and
    a non-display area which surrounds the display area,
    further comprising a printed circuit board which is connected to the display panel at the non-display area thereof.

6. The display device of claim 5, wherein
    a front surface of the cover panel faces the curved back surface of the display panel, and
    a portion of the printed circuit board connected to the display panel at the non-display area thereof is disposed along a back surface of the cover panel opposite to the front surface thereof.

7. The display device of claim 1, wherein the cover panel defined by the flat cover panel which is curved by attachment thereof to the curved back surface of the display panel comprises an adhesive layer, a buffer layer and a dehumidifying layer stacked sequentially in a direction toward the display panel.

8. The display device of claim 7, wherein a cutout portion is defined in each of the adhesive layer, the buffer layer and the dehumidifying layer and the cutout portions thereof overlap each other to define the cutout portion of the flat cover panel.

9. The display device of claim 1, wherein the cutout portion of the flat cover panel is provided in a plurality.

10. The display device of claim 9, wherein the cutout portions of the flat cover panel comprise a first cutout portion and a second cutout portion spaced apart from each other along the outer edge of the flat cover panel.

11. The display device of claim 10, wherein the display panel comprises in the top plan view:
   a display area at which the image is displayed, and
   a non-display area which surrounds the display area, the non-display area comprising:
      a first area extending directly from the display area to define a maximum dimension of the non-display area in a first direction, and
      a second area which protrudes from the first area to dispose the first area between the second area and the display area, a maximum dimension of the second area in the first direction being smaller than that of the first area.

12. The display device of claim 11, wherein
the flat cover panel which is curved to define the cover panel comprises:
   a first portion corresponding to the first area of the non-display area, and
   a second portion which protrudes from the first portion to correspond to the second area of the non-display area, and
the second portion of the cover panel protrudes from the first area thereof to overlap the second area of the non-display area.

13. The display device of claim 11, further comprising:
   a printed circuit board which is connected to the display panel, and
   a connection portion in the second area of the non-display area, at which the printed circuit board is connected to the display panel,
wherein the second portion of the cover panel protrudes from the first area thereof to overlap the connection portion.

14. The display device of claim 11, wherein
for the display panel in the top plan view,
   the second area having the maximum dimension smaller than that of the first area meets the first area at a first point and a second point spaced apart from each other along the first direction, and
   a first reference line is defined connecting the first point and the center of the flat cover panel and a second reference line is defined connecting the second point and the center of the flat cover panel,
the first cutout portion of the flat cover panel is disposed overlapping the first reference line defined for the display panel, and
the second cutout portion of the flat cover panel is disposed overlapping the second reference line defined for the display panel.

15. The display device of claim 14, wherein
the second portion of the cover panel which protrudes from the first portion thereof to correspond to the second area of the non-display area meets the first portion at a first point of contact and a second point of contact spaced apart from each other along the first direction,
the first point of contact of the cover panel is disposed on the first reference line defined for the display panel, and
the second point of contact of the cover panel is disposed on the second reference line defined for the display panel.

16. The display device of claim 1, wherein in the top plan view:
   the display panel comprises a display area at which the image is displayed, the display area having a circular planar shape,
   the flat cover panel which is curved to define the cover panel has a circular planar shape, and
   the cutout portion of the flat cover panel having the circular shape is recessed from a circumference of the flat cover panel toward the center of the flat cover panel.

17. The display device of claim 1, wherein in the top plan view, the cutout portion of the flat cover panel has a fan shape.

18. A method of manufacturing a display device, the method comprising:
   preparing a cover window attached to a display surface of a display panel which is curved and displays an image;
   disposing a flat cover panel comprising a cutout portion recessed from an outer edge of the flat cover panel toward a center thereof in a top plan view, on a curved back surface of the display panel; and
   pressing the flat cover panel to the curved back surface of the display panel to form the display device including a cover panel which is curved along the curved back surface of the display panel and the cover window attached thereto.

19. The method of claim 18, wherein the pressing of the flat cover panel to form the cover panel curved along the curved back surface of the display panel comprises pressing the flat cover panel to the display panel by rotating a pressure roll in a clockwise direction or a counterclockwise direction about the center of the flat cover panel.

20. The method of claim 18, wherein the pressing of the flat cover panel to form the cover panel curved along the curved back surface of the display panel comprises:
   disposing the flat cover panel between the curved back surface of the display panel and a domed pressure pad, and
   with the flat cover panel between the curved back surface of the display panel and the domed pressure pad, moving the domed pressure pad toward the display panel.

* * * * *